United States Patent
Erpelding et al.

(10) Patent No.: US 6,523,250 B2
(45) Date of Patent: Feb. 25, 2003

(54) METHOD OF ATTACHING A SLIDER WITH HEAD TRANSDUCER TO A SUSPENSION

(75) Inventors: A. David Erpelding, San Jose, CA (US); Surya Pattanaik, San Jose, CA (US); Calvin Dean Lantrip, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 09/814,567

(22) Filed: Mar. 21, 2001

(65) Prior Publication Data

US 2002/0133933 A1 Sep. 26, 2002

(51) Int. Cl.⁷ .............................................. G11B 5/127
(52) U.S. Cl. ................. 29/603.04; 29/603.02; 29/603.06; 360/234.5; 360/234.6
(58) Field of Search ................. 29/603.01, 603.02, 29/603.03, 603.04, 603.05, 603.06; 360/234.5, 234.6

(56) References Cited

U.S. PATENT DOCUMENTS

| | | | |
|---|---|---|---|
| 4,761,699 A | 8/1988 | Ainslie et al. | 360/103 |
| 4,789,914 A | 12/1988 | Ainslie et al. | 360/103 |
| 5,530,604 A | 6/1996 | Pattanaik | 360/104 |
| 5,757,585 A | 5/1998 | Aoyagi et al. | 360/104 |
| 5,821,494 A * | 10/1998 | Albrecht et al. | 219/121.64 |
| 5,828,031 A | 10/1998 | Pattanaik | 219/121.63 |
| 5,889,636 A | 3/1999 | Prakash et al. | 360/104 |
| 6,036,813 A | 3/2000 | Schulz et al. | 156/307.7 |
| 6,382,499 B1 * | 5/2002 | Satoh et al. | 228/173.1 |

FOREIGN PATENT DOCUMENTS

| | | | | |
|---|---|---|---|---|
| JP | 09282626 | 7/1994 | | G11B/5/60 |

* cited by examiner

Primary Examiner—Steven O. Douglas
Assistant Examiner—Peter deVore
(74) Attorney, Agent, or Firm—Lewis L. Nunnelley

(57) ABSTRACT

A method for assembling a slider suspension assembly for use in a disk drive is disclosed. A ceramic slider with an attached recording head is placed on a suspension and is held in alignment by soldering the electrical connections while the epoxy placed between the slider and the suspension hardens. The method results in a much more economical process which does not require the number of expensive tools needed to carry out the conventional process.

4 Claims, 8 Drawing Sheets

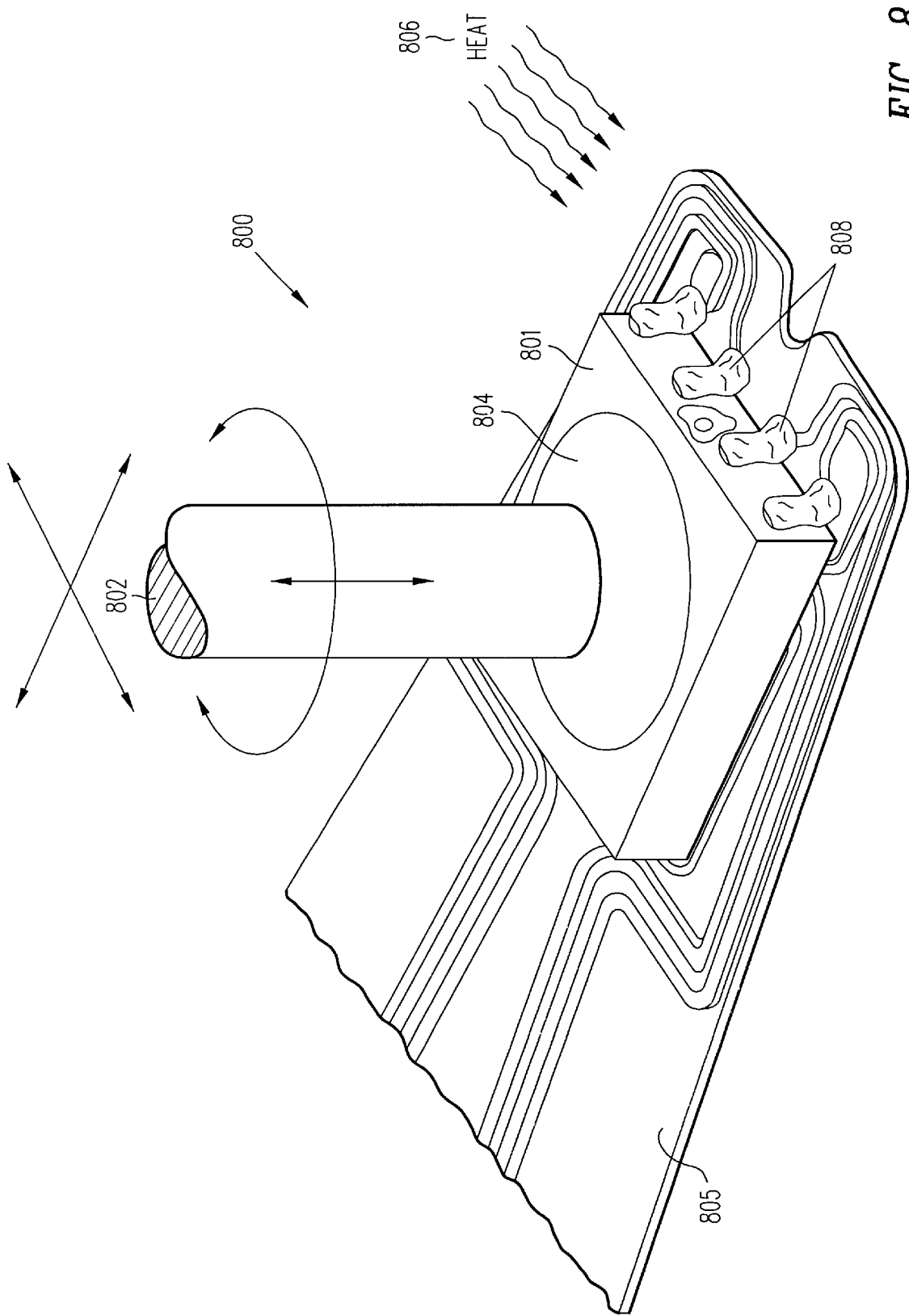

METHOD OF ATTACHING A SLIDER WITH HEAD TRANSDUCER TO A SUSPENSION

BACKGROUND OF THE INVENTION

1. Field of the Invention

A method for assembling a slider suspension assembly for use in a disk drive is disclosed. A ceramic slider with an attached recording head is placed on a suspension and is held in alignment by soldering the electrical connections while the epoxy placed between the slider and the suspension hardens. The method results in a much more economical process which requires far fewer expensive assembly fixturing tools compared to the conventional process.

2. Description of the Background Art

A slider with attached magnetic recording head in a disk drive is attached to a flexible metal structure generally referred to as a suspension. The usual method of attachment is to place a small amount of epoxy to the interface between the slider and the suspension. Electrical connections must also be made to the recording head. These connections are either wires or thin metal stripes called traces which are attached to the suspension or fabricated as part of the suspension, and subsequently attached to the recording head structure.

There are several conventional methods of constructing this slider suspension assembly, also known as a head-gimbal assembly. One method, the most common, is to place the slider precisely onto the suspension and hold it there with a precision tool while the epoxy hardens. After the epoxy hardens, the electrical connections are then completed. This method has the disadvantage that precision alignment and clamping tools are needed to hold the slider in place while the epoxy hardens. Since the hardening process takes some time, there is a need to replicate many of these precision tools in a manufacturing environment resulting in an expensive process. It is. known to use conductive epoxy to accomplish both the slider suspension mechanical connection in addition to the electrical connection. However this compromises both physical and electrical connections and does not result in appreciable process cost reduction. It is also known to mount the slider using only the soldered electrical connections without any epoxy mechanical connection. This approach has the process advantage of avoiding the hardening time required for epoxy. However since solder is not a very compatible material with the ceramic slider material, additional structural elements and complexity is required. This approach results in either comprised mechanical performance or an undesirable increase in thickness of the slider suspension assembly. Technically, an epoxy connection for the slider suspension mechanical interface and a solder connection for the electrical connections work well. The main problem is the expensive process step of requiring continuous precision alignment during the hardening of the epoxy.

SUMMARY OF THE INVENTION

The invention described below is an improved method wherein the need for precision alignment tooling has been minimized.

In the preferred embodiment of the method of the present invention a slider is placed into position on a suspension in an alignment device such as an alignment fixture and an amount of epoxy is applied to the mechanical interface between the slider and suspension. Then, before the epoxy has hardened, a solder electrical connection is made between the recording head and the wires or traces on the suspension. The soldered connection is rigid enough so that the slider can then be removed from the alignment device and set aside without any supporting alignment device while the epoxy is hardening. This method greatly reduces the amount of time during which the slider suspension combination must remain in the alignment device. Thus the number of these expensive fixtures can be greatly reduced resulting in a much more economical process. In an alternative embodiment, this invention also makes the use of a robotic positioning device economically feasible for achieving precision alignment of the slider and suspension. A robotic positioning device would be used in place of an alignment device.

BRIEF DESCRIPTION OF THE DRAWINGS

FIG. 1*a* shows the slider prior to placement on the suspension.

FIG. 2*a* shows the slider prior to placement on the suspension.

FIG. 3 shows an illustration of the method steps where the slider is positioned on the suspension before the solder is applied to the head and electrical connections.

FIG. 4 shows an illustration of the method steps where the slider is positioned on the suspension before the solder is applied. In this case the electrical leads on the suspension are bent out of the plane of the suspension.

FIG. 8 shows a typical robotic positioning device.

DETAILED DESCRIPTION OF THE INVENTION

In all of the embodiments of the invention the slider is a conventional ceramic material upon which the recording head assembly is constructed. The slider material is commonly, but not limited to, Alumina-TiC. The recording head structure is constructed on the trailing surface of the slider. This trailing surface also has metallic pads which are connected to the elements of the recording head. Recording heads typically have a separate read and write element and thus require four separate metallic pads on the trailing surface for electrical connection. One of the surfaces of the slider is designed to be flown in close proximity to the disk and accordingly has an air bearing surface. This side of the slider accordingly has a first surface which has features or rails which will be in close proximity to the disk and a second surface, recessed from the first surface, which delineate the features of the air bearing. The slider recording head assembly is then mounted on a suspension using an epoxy adhesive for the mechanical connection of the slider to the suspension and solder for the electrical connection from the head elements to the wires or traces on the suspension.

Figure 1A:
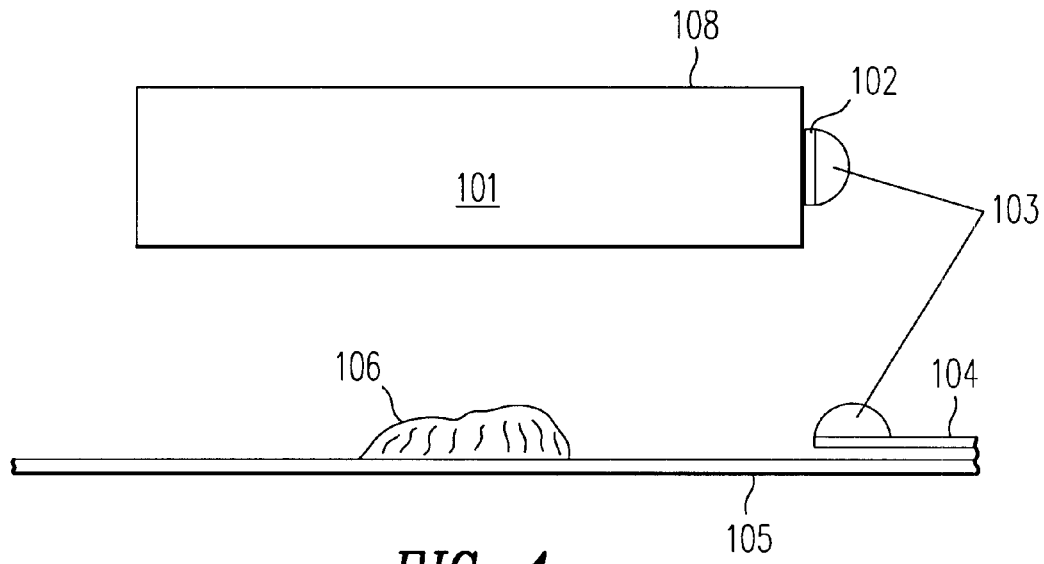
FIGS. 1*a*, *b*, and *c* illustrate the method steps where the solder is applied to the head connections on the slider and the electrical connections on the suspension.
Figure 1B:
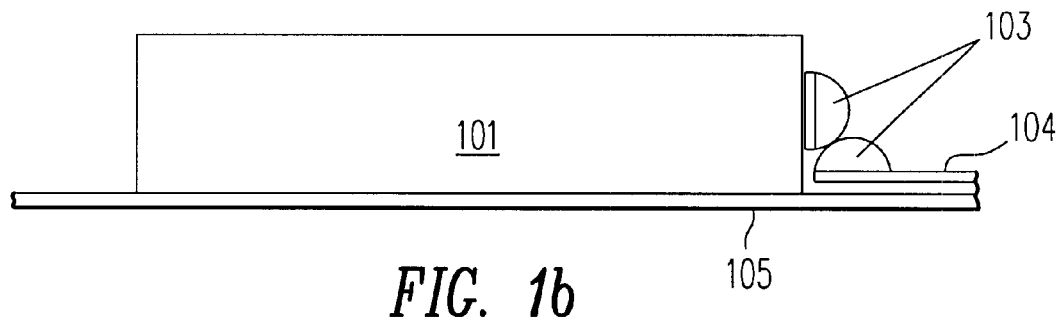
FIG. 1*b* shows the attached slider prior to the reflow solder process.
Figure 1C:
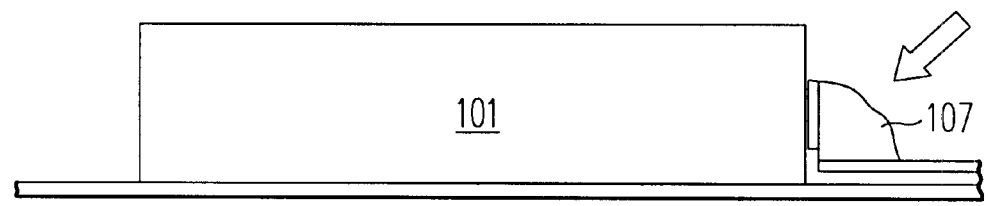
FIG. 1*c* shows the completed assembly after the reflow solder step.
Figure 7:
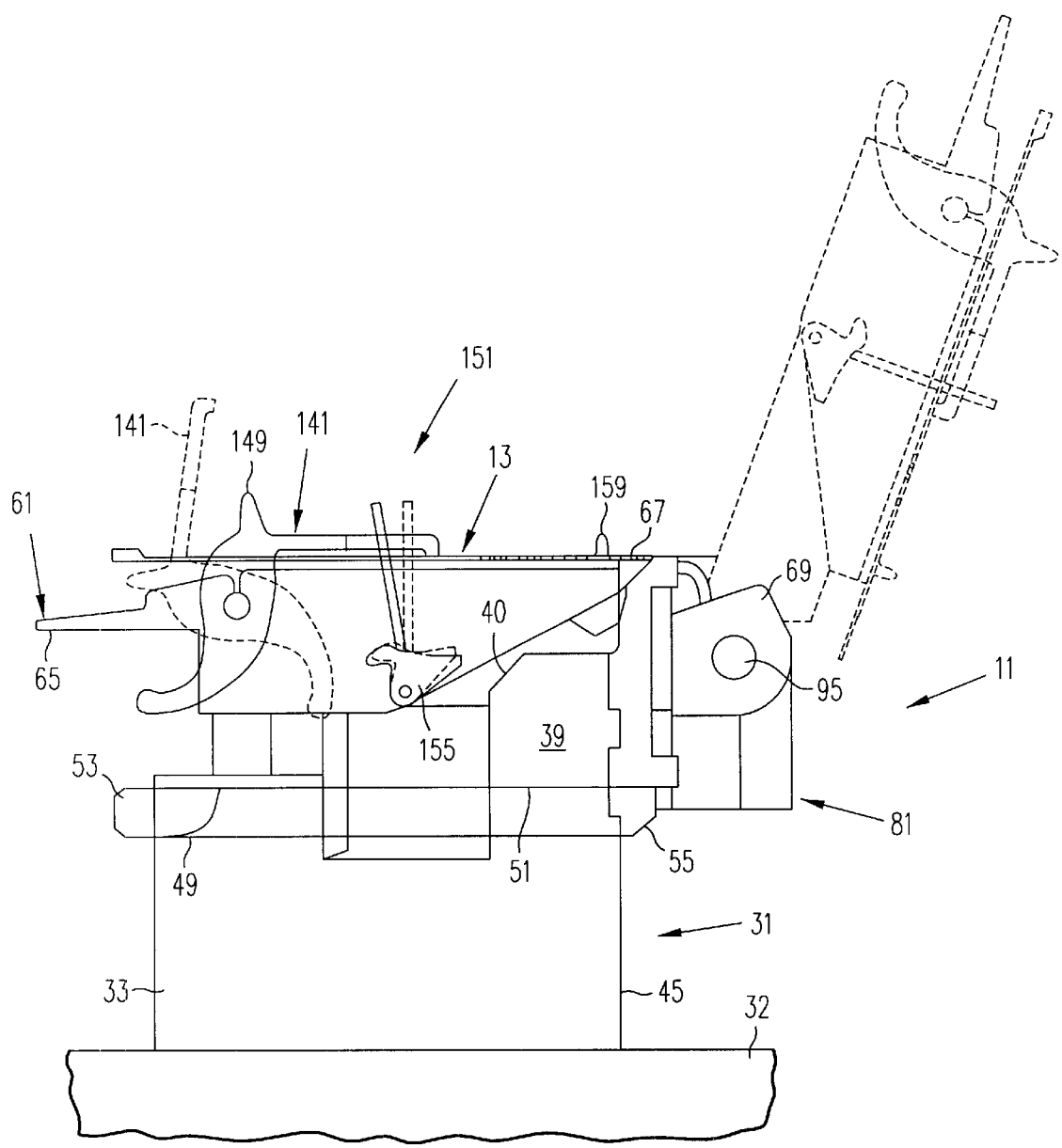
FIG. 7 shows a view of a typical precision fixture.

One preferred embodiment of this invention is illustrated in FIG. 1. FIG. 1a shows the slider 101 with an air bearing surface 108 before it is mounted on the suspension 105. Also shown is solder 103 which has been deposited on the metallic pads 102 of the head assembly and also on the ends of the wires or traces 104. The epoxy 106 is generally placed on the suspension before the slider 101 is positioned. FIG. 1b shows the slider 101 as it has been positioned on the suspension 105 using a precision alignment device such as a fixture. One view of a typical fixture is shown in FIG. 7. In FIG. 1b the two depositions of solder have not yet been joined or connected. FIG. 1c shows the process of adding heat to the solder in order to cause solder reflow. The solder connection can be produced by various methods such as solder screening and reflow, solder wire ball bumping with or without reflow, and solder plating with or with reflow. The result is that the two bumps of solder merge into one and form an electrical connection. The solder connection is made by only heating the solder without heating the entire slider. One method of making the solder connection is to apply heat using a laser. Even though the epoxy adhesive has not yet hardened, the strength from the solder connection allows the slider suspension assembly to be removed from the precision alignment device and set aside until the epoxy has hardened. This allows the alignment device to be immediately used to assemble another slider suspension assembly in the manufacturing environment.

For purposes of this invention a precision alignment device can be either a fixture or a precision robot apparatus. An example of a precision fixture is shown in U.S. Pat. No. 5,959,827 which is incorporated by reference herein. In U.S. Pat. No. 5,959,827 the precision alignment fixture is referred to as a tool block. FIG. 8 shows a view of a robotic apparatus. A robotic tool 800 which has a central suction tube 802 and a flexible suction cup 804 precisely positions the slider 801 with respect to the suspension 805. A heating means 806 then makes the solder connection 808.

Figure 2A:
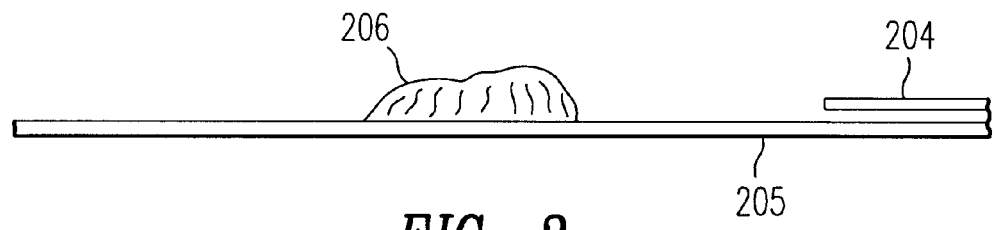
FIG. 2*a*, *b*, and *c* shows an illustration of the method steps where the solder is applied to the head connections on slider but not on the electrical connections on the suspension.
Figure 2B:
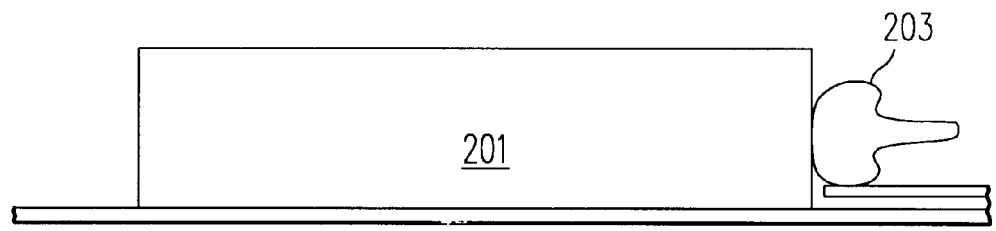
FIG. 2*b* shows the attached slider prior to melting the solder bump.
Figure 2C:
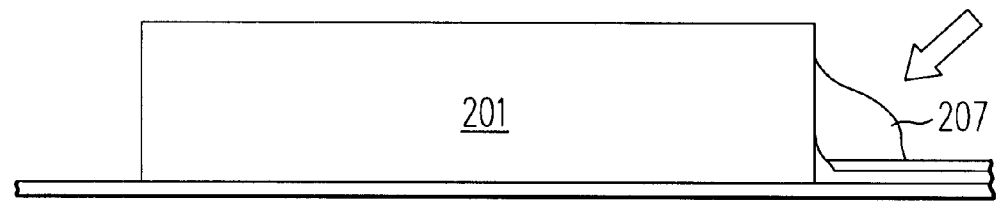
FIG. 2*c* shows the completed assembly after the solder is melted.
Figure 3A:
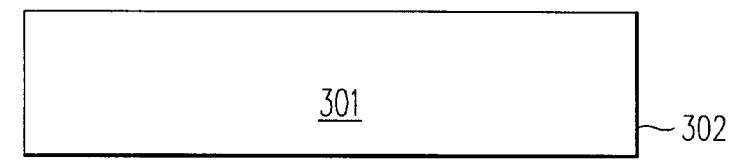
FIG. 3*a* shows the slider before placement on the suspension.
Figure 3A:
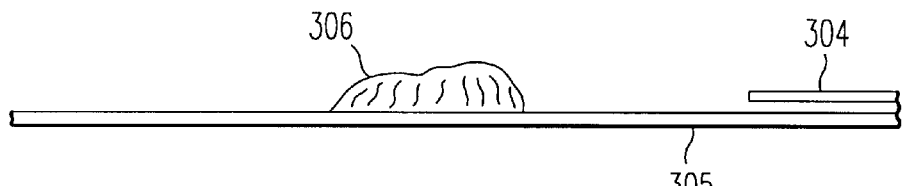
Figure 3B:
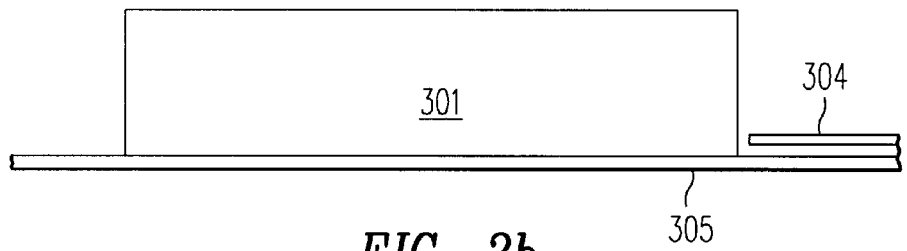
FIG. 3*b* shows the slider after placement on the suspension but before the solder is placed.
Figure 3C:
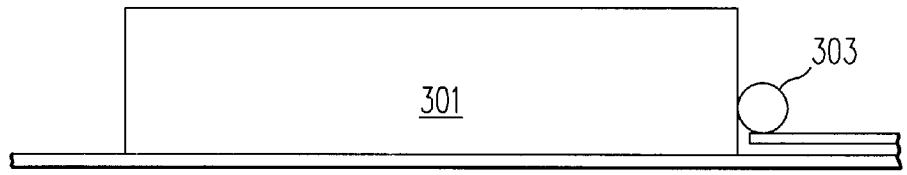
FIG. 3*c* shows the slider after placement of the solder.
Figure 3D:
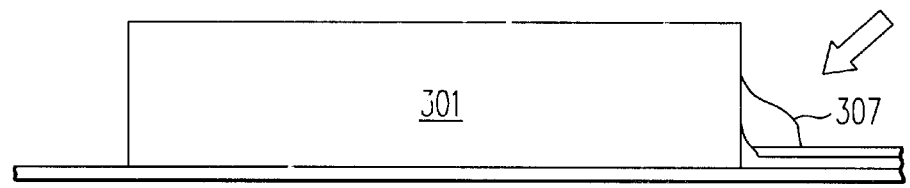
FIG. 3*d* shows the slider after the solder has melted.
Figure 4A:
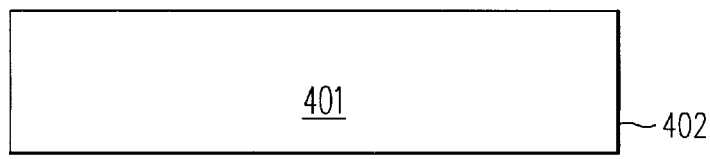
FIG. 4*a* shows the slider before placement on the suspension.
Figure 4A:
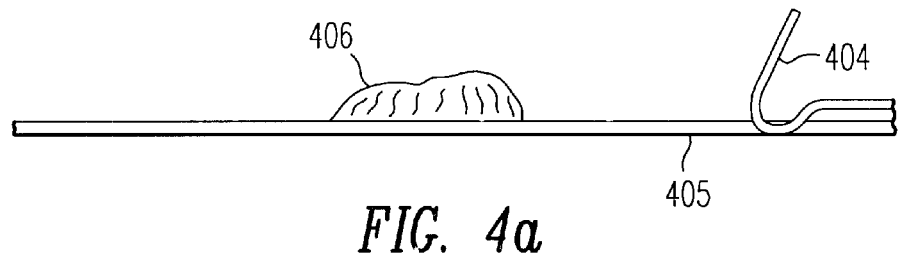
Figure 4B:
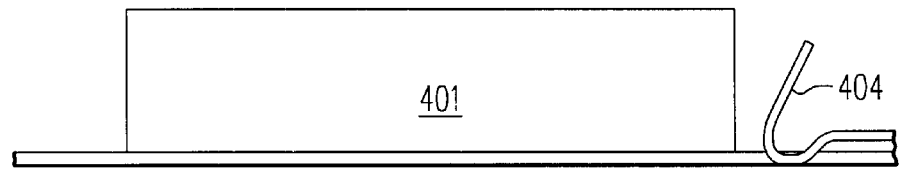
FIG. 4*b* shows the slider after placement on the suspension and before the placement of solder.
Figure 4C:
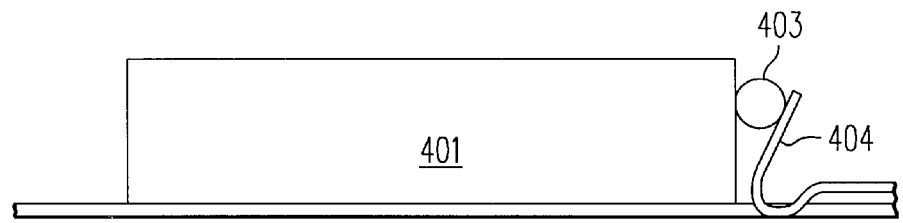
FIG. 4*c* shows the slider after placement of the solder between the bent leads and the slider.
Figure 4D:
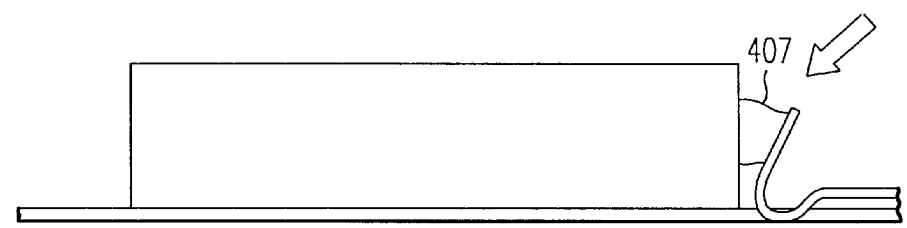
FIG. 4*d* shows the slider after melting the solder.

A second preferred embodiment is shown in FIG. 2. FIG. 2a shows a slider before positioning onto the suspension 205. The adhesive epoxy 206 is also shown. There is no initial solder place on the electrical leads 204. However the amount of solder 203 placed on the head pads 202 is larger than was the case for the first embodiment illustrated in FIG. 1. This solder 203 subsequently makes electrical connection to the electrical leads 204. The remainder of the process is similar to that illustrated in FIG. 1. The slider is positioned onto the suspension as shown in FIG. 1b. The heating step is shown in FIG. 1c. Suitable heating methods include using a laser, or an appropriate light source delivered with a fiber optics bundle. The result is a solder connection 207 between the pads and the electrical connection on the suspension. After the soldering step, the slider suspension is then removed from the precise device or fixturing allowing the fixturing to be immediately used for another iteration of the manufacturing process.

A third preferred embodiment is illustrated in FIG. 3. FIG. 3a shows a slider 301 with attached head pads 302 before positioning onto the suspension 305 which has the adhesive epoxy 306 and the ends of the electrical leads 304. In this case the solder has not yet been applied to either the pads 302 or the electrical leads 304. FIG. 3b shows the slider 301 positioned on the suspension 305. FIG. 3c shows the addition of a solder ball 303 at the junction of the head pads 302 and the electrical leads 304. FIG. 3d shows the solder after heating and making contact with the head pads 302 and the leads on the suspension 304. After the soldering step, the slider suspension is then removed from the fixturing allowing the fixturing to be immediately used for another iteration of the manufacturing process.

A fourth embodiment of the invention is illustrated in FIG. 4. In FIG. 4a the slider 401 is shown before placement on the suspension 405. The adhesive epoxy 406 is shown. In this case the end of the electrical leads 404 on the suspension is lifted away from the plane of the slider suspension interface. FIG. 4b shows the assembly after positioning the slider but before application of the solder. The bent leads can be more conducive for holding the solder ball 403 (FIG. 4c) in place. FIG. 4d shows the completed assembly after heating in which the solder 407 makes electrical contact with the head pads 402 and the bent leads 404. After the soldering step, the slider suspension is then removed from the precision alignment device allowing the device to be immediately used for another iteration of the manufacturing process.

A common and critical aspect of all of the preferred embodiments is that after the electrical connection is made, the slider suspension assembly may be immediately removed from the alignment device prior to hardening of the epoxy in order to increase throughput on this expensive equipment.

Figure 5:
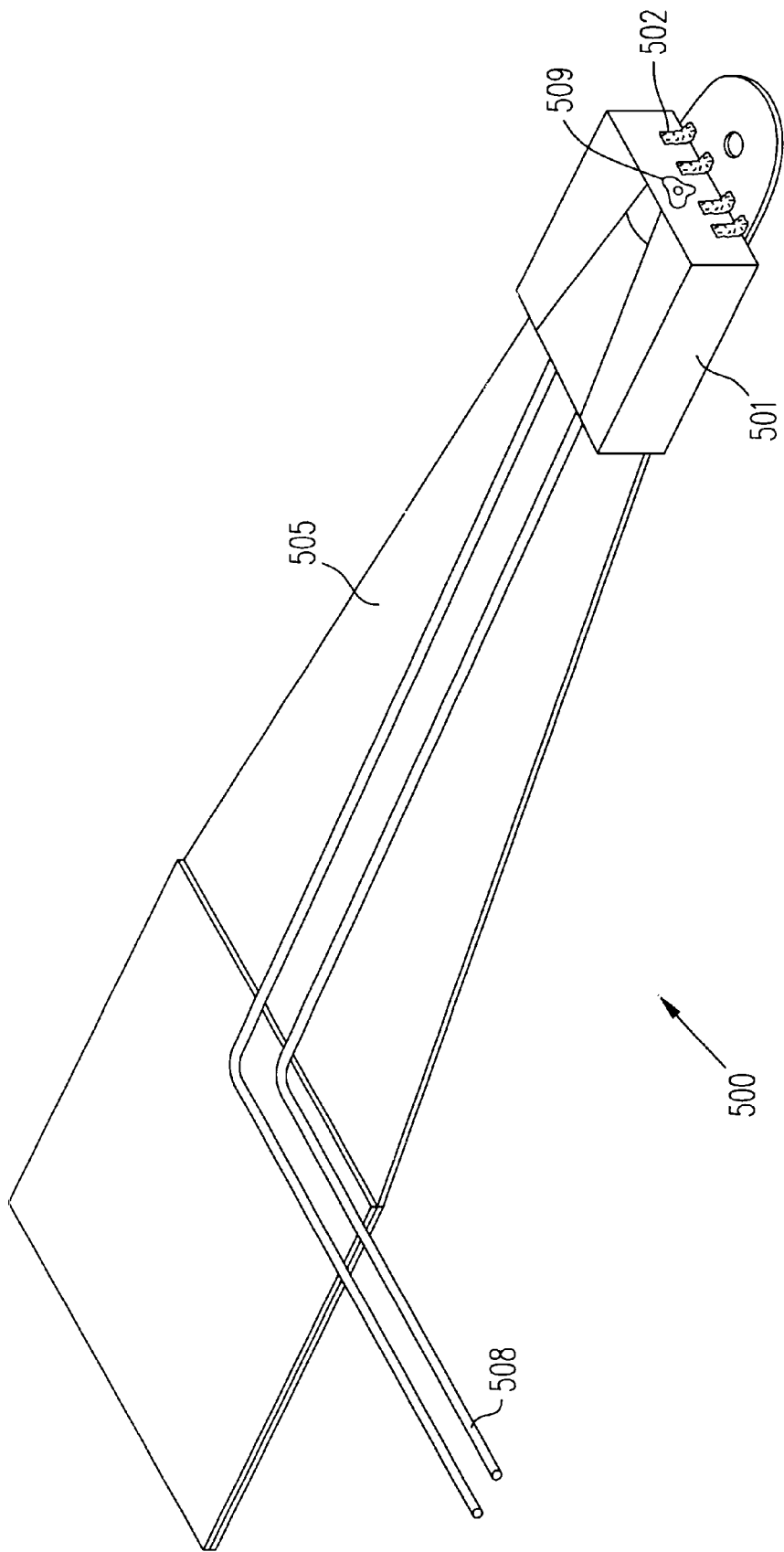
FIG. 5 shows a view of the completed slider suspension assembly.

A completed slider suspension assembly 500 is shown in FIG. 5. The slider 501 is attached to the suspension 505. The electrical leads 508 usually extend along the length of the suspension 505 and provide electrical connection to be made to the recording head 509 through the solder connection to the head pads 502. In some cases these electrical leads are fabricated as part of the suspension. In other cases the leads are attached to the suspension after being fabricated separately.

Figure 6:
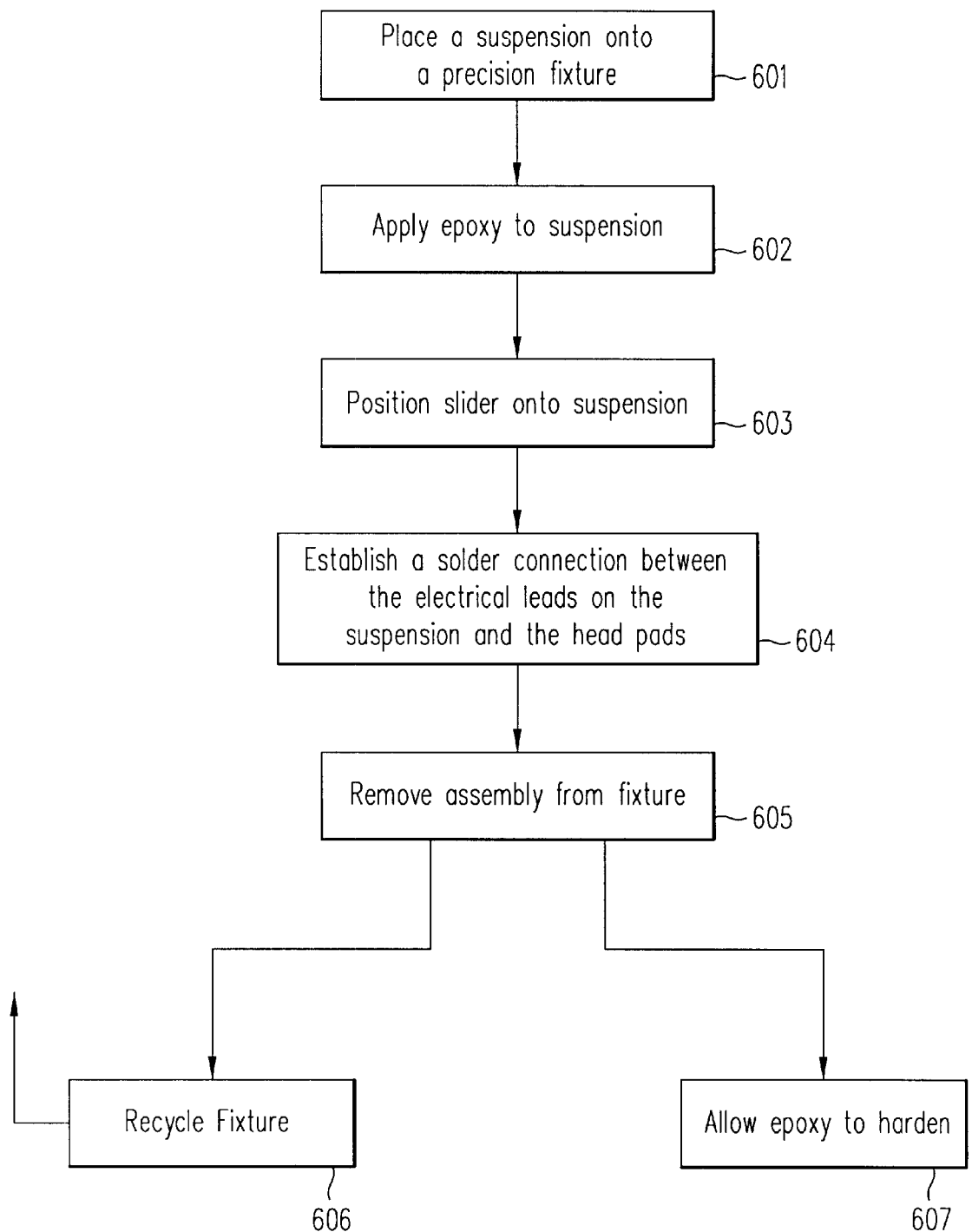
FIG. 6 shows a flow diagram outlining the present invention.

A flow diagram which illustrates the invented process is shown in FIG. 6. The suspension is placed on a precision fixture 601. Epoxy is then added to the suspension 602. The slider is then positioned onto the suspension 603. A solder connection is made between the electrical leads on the suspension and the head pads by using any of the preferred embodiments 604. The slider suspension assembly is then removed from the fixture 605 which releases the fixture to be recycled in the process 606. The assembly is then set aside and the epoxy is allowed to harden 607.

A single fixture for slider suspension assembly can cost well over a thousand dollars. A manufacturing process which might require 100 fixtures for a conventional process would require approximately 10 fixtures using the invented process. This results in a ten fold reduction of cost and an increase in efficiency in the invented process.

While the invention has been shown and described with respect to preferred embodiments thereof, it will be understood by those skilled in the art that changes in form and detail may be made in these embodiments without departing from the scope and teaching of the invention. Accordingly, the method herein disclosed is to be considered merely as illustrative, and the invention is to be limited only as specified in the claims.

We claim:

1. A method of assembling a slider suspension assembly for use in a magnetic recording device, comprising:

placing a suspension having attached electrical leads in an alignment device;

applying adhesive epoxy to said suspension;

positioning a slider, having a head structure with attached metallic pads used for making electrical connections to said head structure, onto said suspension;

making a solder connection between said electrical leads on said suspension and said pads on said head structure, and;

removing the connected slider suspension assembly from said alignment device before said epoxy has hardened.

2. The method of claim 1 wherein said alignment device is a fixture.

3. The method of claim 1 wherein said alignment device is a robot machine.

4. The method of claim 1 wherein said solder connection is made by heating with a laser.

* * * * *